(12) United States Patent
Al-Sehemi et al.

(10) Patent No.: US 10,964,899 B1
(45) Date of Patent: Mar. 30, 2021

(54) HYBRID JUNCTION SOLAR LIGHT SENSITIVE DEVICE

(71) Applicant: King Abdulaziz University, Jeddah (SA)

(72) Inventors: Abdullah G. Al-Sehemi, Jeddah (SA); Ahmed A. Al-Ghamdi, Jeddah (SA); Abul Kalam, Jeddah (SA); Aysegul Dere, Jeddah (SA); Fahrettin Yakuphanoglu, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/089,796

(22) Filed: Nov. 5, 2020

(51) Int. Cl.
*H01L 51/42* (2006.01)
*H01L 51/00* (2006.01)

(52) U.S. Cl.
CPC ...... *H01L 51/4213* (2013.01); *H01L 51/0046* (2013.01)

(58) Field of Classification Search
CPC .................. H01L 51/4213; H01L 51/0046
See application file for complete search history.

(56) References Cited

U.S. PATENT DOCUMENTS

| | | | |
|---|---|---|---|
| 2009/0308458 A1 | 12/2009 | Aramaki | |
| 2010/0084010 A1* | 4/2010 | Dumitru | H01L 51/4213 136/255 |
| 2014/0150859 A1* | 6/2014 | Zakhidov | H01G 9/2059 136/255 |
| 2014/0361409 A1 | 12/2014 | Rogers et al. | |

FOREIGN PATENT DOCUMENTS

| | | |
|---|---|---|
| JP | 5688646 B2 | 3/2015 |
| JP | 2018006558 A | 6/2016 |
| KR | 2014041513 A | 4/2014 |

* cited by examiner

*Primary Examiner* — Quoc D Hoang
(74) *Attorney, Agent, or Firm* — W & C IP

(57) ABSTRACT

A hybrid junction solar light sensitive photodiode includes at least one inorganic p-n junction and at least one organic semiconductor p-n junction (pnpn) in series. The photoresponse properties of the photodiode is controlled using an inorganic layer and an organic layer. The photoactive layer is an organic semiconducting material having a mobility higher than 0.5 $cm^2/Vs$. The metal oxide layer is an oxide semiconductor comprising of ternary oxides.

30 Claims, 2 Drawing Sheets
(1 of 2 Drawing Sheet(s) Filed in Color)

HYBRID JUNCTION SOLAR LIGHT SENSITIVE DEVICE

FIELD OF THE INVENTION

The present invention generally relates to a hybrid junction solar light sensitive device including a p-n junction and metal-semiconductor junction for solar tracking systems.

BACKGROUND

Optoelectronic devices are photosensitive and electronically generate electric current by electromagnetic radiation. The optoelectronic devices generate the electric current from the various light sources. In some applications, the optoelectronic devices are used to convert solar light into electric current for solar tracking systems.

One type of optoelectronic device is a photodiode, such as a photodiode used to detect electric signals due to sun light absorption. In operation, a photodiode is used to detect the electric current with a heterojunction structure. The photocurrent is measured when the photodiode is exposed to sun light irradiation. The device with the heterojunction measures the electronic response of the photodiode to sun light irradiation or electromagnetic irradiation. The photodiode devices may be characterized by their rectifying properties with external applied voltage.

Conventional optoelectronic devices are manufactured from inorganic semiconductors such as silicon, gallium arsenide, indium phosphide and others. In optoelectronic devices, a photoactive layer is formed from the inorganic semiconductors. The semiconductors can conduct electric current by electromagnetic radiation. The photoactive layer is chosen for its absorption properties to generate the electric current via electromagnetic radiation.

Organic electronics are based on organic semiconductors which have semiconducting behavior. Organic electronics have many applications in electronic technology. The organic semiconductors may be used with inorganic semiconductors as hybrid electronic devices. In addition, organic semiconductors include conjugated polymers, molecular semiconductors, and small organic compounds.

Photodiodes are typically formed by various combinations of junctions such as semiconductor-semiconductor and metal/semiconductor junctions. When a semiconductor-semiconductor and a metal/semiconductor junction are used in fabrication of the diode, the device is known as hybrid junction based photodiode. If the photodiode is formed from a semiconductor-semiconductor junction and metal/semiconductor, the photodiode is called a hybrid photodiode. There is a need for solar light sensitive photodiodes for solar tracking systems where such photodiodes will have high performance parameters, and will be made at low cost, be more reliable, and have easy fabrication methods. There is also a need for an organic photodiode that exhibits a high sensitivity to solar light.

SUMMARY

One aspect of the present invention relates to a method of manufacturing a hybrid solar light sensitive photodiode. The preparation method of the diode includes the steps of providing an inorganic p-n junction and an organic p-n junction. This device is referred to herein as a solar light sensitive photodiode. The solar light sensitive photodiode includes a conventional semiconductor and a metal oxide semiconductor. This junction comprising the conventional semiconductor and the metal oxide semiconductor is referred to herein as a "inorganic p-n junction". The solar light sensitive photodiode includes also a p-type organic semiconductor and n-type organic semiconductor. The junction comprising the p-type organic semiconductor and the n-type organic semiconductor is referred to herein as a "organic p-n junction". The inorganic p-n junction is in series with the organic p-n junction. The junction comprising the inorganic junction and the organic p-n junction is referred to herein as a "hybrid junction".

A functional material is described below for the photoactive layer in organic photodiode. A photodiode includes a photosensitive layer, metal electrodes and an encapsulation. The photosensitive layer absorbs electromagnetic radiation including ultraviolet light, visible light, and infrared radiation, and it converts the light energy to current or voltage. The photoactive layer includes organic semiconductors comprising hole conductor material, electron injection material, conjugated polymers, aromatic small molecules. Light energy can be absorbed when it is higher than the band gap value of the organic semiconductor and an exciton is formed. In a light absorbing process, a charge separation mechanism is formed, and, in turn, photoconductive and photovoltaic effects take place in the photodiode.

In various embodiments of the invention, the organic semiconductor is tetrathiafulvalene and its derivatives and charge transfer complexes.

In various embodiments of the invention, the material of above-mentioned oxide semiconductor is YSrA, where A is $ZnO$, $CoO_3$, or $MnO_3$.

In various embodiments of the invention, a light sensitive organic photoactive layer is used in the switchable photodiodes. Thus, in some forms, the invention is embodied in or as organic semiconductors. The organic photoactive layer can be s-rich organic compounds, small molecules organics, acceptor-donor blends, and conjugated polymers. Organic semiconductors can include donor and acceptor organic materials.

In an embodiment of the invention, the step for preparing the photoactive layer comprises providing tetrathiafulvalene (TTF) a photoactive layer and a conventional semiconductor to form a semiconductor-semiconductor and metal/semiconductor junctions in series.

The diode can be prepared in active layers onto hard or flexible substrates with controllable shapes. For example, the organic and oxide layers can be spin coated from solution onto a conventional semiconductor substrate. The photoactive organic and tunneling layers can be coated onto uniform substrates by means of, for example, spin coating and drop casting. In a preferred embodiment, the method for preparing the oxide tunneling buffer layer comprises a drop casting method.

Hybrid photodiodes prepared according to various aspects of the invention may be utilized in solar tracking systems. The photoconductive response of the hybrid photodiode is due to the transfer of photogenerated charge carriers.

According to the invention, the photodiodes generate the charge carriers under solar light illumination. The junctions of the photodiode are at least one inorganic pn junction and at least one organic pn junctions in series. The inorganic pn junction may have a polysilicon (p-Si) semiconductor and an oxide semiconductor (e.g., a ternary metal oxide layer). The organic p-n junction preferably comprises a p type organic semiconductor and an n-type organic semiconductor. The photodiodes and optoelectronic devices of this invention may be used in a wide variety of applications which require a photoresponse. The photodiodes can be produced at reduced costs and may replace organic photodiodes and existing inorganic photodiodes

BRIEF DESCRIPTION OF THE DRAWINGS

The patent or application file contains at least one drawing executed in color. Copies of this patent or patent application publication with color drawings will be provided by the Office upon request and payment of the necessary fee.

The accompanying drawings, which are incorporated in and constitute a part of this specification, illustrate embodiments of the invention and, together with a general description of the invention given above, and the detailed description given below, serve to explain the invention.

Various embodiments of this disclosure will be described with the reference to the accompanying drawings.

Figure 1:
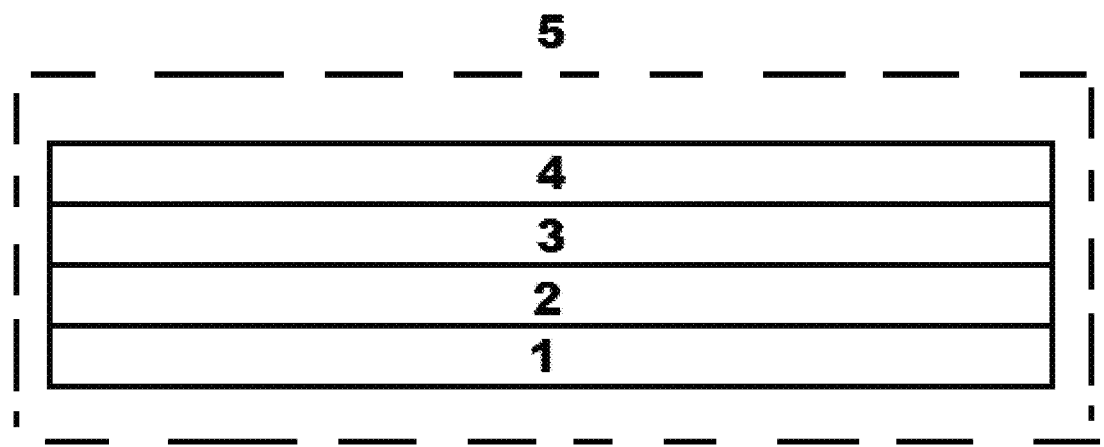

FIG. 1 is a schematic drawing of a generalized structure of the pnpn photodiode.

Figure 2:
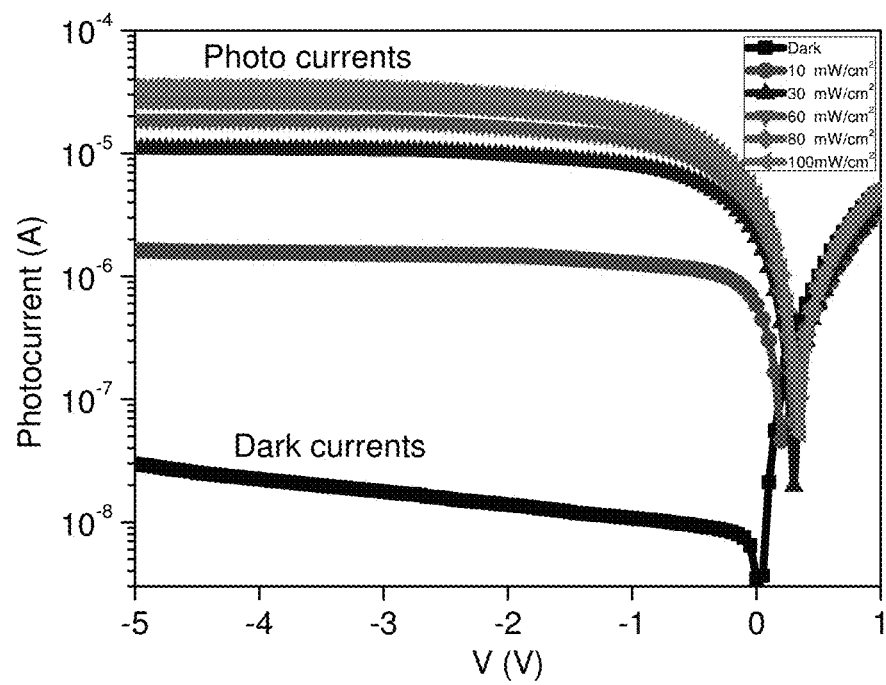

FIG. 2 is a graph showing the photocurrent-voltage characteristics of the pnpn photodiode according to FIG. 1.

Figure 3:
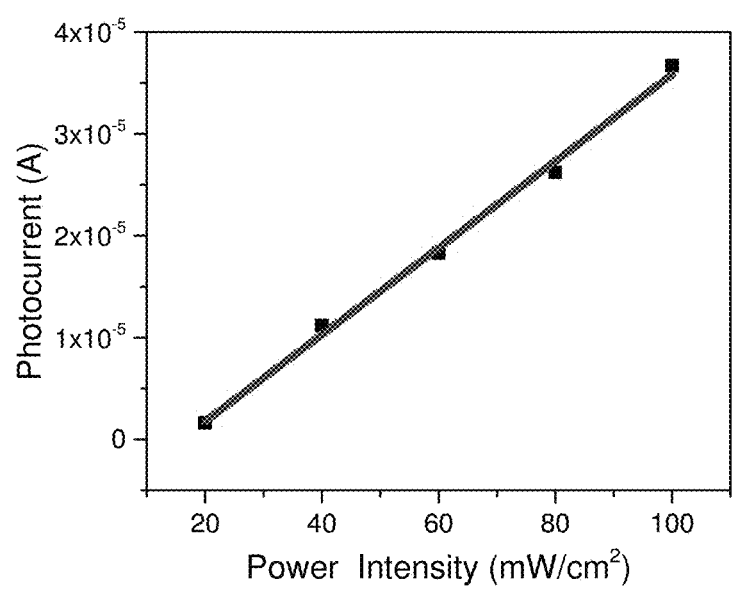

FIG. 3 is a graph showing the photocurrent-power intensity characteristics of the pnpn photodiode according to FIG. 1.

DETAILED DESCRIPTION

New semiconductor materials to obtain high photoresponsivity of the organic thin films are described with a new junction structure. The organic and oxide semiconductors exhibit high photoresponsivity, light absorption, and electrical conductivity suitable for photodiode devices. A hybrid junction photodiode according to the invention is made up of at least one inorganic p-n junction and at least one organic p-n junction in series. The hybrid junction is formed from two interfaces of an inorganic p-n junction and an organic p-n junction.

With reference to FIG. 1, the preparation method of the diode includes the steps of providing an inorganic p-n junction and an organic p-n junction. This device is referred to herein as a solar light sensitive photodiode 5. The solar light sensitive photodiode 5 includes a conventional semiconductor layer 1 and a metal oxide semiconductor layer 2. The junction comprising the conventional semiconductor layer 1 and the metal oxide semiconductor layer 2 is referred to as an "inorganic p-n junction". In addition, the solar light sensitive photodiode 5 includes at least one p-type organic semiconductor layer 3 and at least one n-type organic semiconductor (n-OSC) layer 4. The junction comprising the p-type organic semiconductor (p-OSC) layer 3 and the n-type organic semiconductor layer 4 is referred to as a "organic p-n junction". The inorganic p-n junction is in series with the organic p-n junction. The junction comprising the inorganic junction and the organic p-n junction is referred to herein as a "hybrid junction". In this case, pnpn photodiode is a hybrid junction have an inorganic junction 1-2 and an organic junction 3-4 in series.

The semiconductor metal oxide layer may allow for the tunneling of charge carriers in the photodiode. The metal oxide layer may be from a group of various metal oxide materials such as the yttrium oxide, strontium oxide, manganese oxide, zinc oxide, copper oxide, cadmium as YSrAO (A=Mn, Zn, Co, Cd). In an exemplary embodiment, the metal oxide layer is a ternary metal oxide and is made of material of the formula $Y_{1-x}Sr_x$ A, where A=ZnO, CdO, $CoO_3$, or $MnO_3$ and $0 \leq x \leq 1$. For example, the ternary metal oxide composite semiconductors used in the practice of the invention may comprise yttrium-strontium-zinc oxide ($Y_{1-x}Sr_xZnO$), yttrium-strontium-cobalt oxide ($Y_{1-x}Sr_xCoO_3$), yttrium-strontium-manganese oxide ($Y_{1-x}Sr_xMnO_3$), yttrium-strontium-zinc oxide ($Y_{1-x}Sr_xZnO$) and yttrium-strontium-copper oxide ($Y_{1-x}Sr_xCuO$) layers, and these may be coated on the surface of the inorganic semiconductor. The absorption of photoactive layer may be tuned using nanostructure metal oxide particles. Oxide composite layer may be formed from the conducting oxide layers to absorb the solar radiation. The oxide buffer layer (OBL) may be from the YSrA (A:ZnO, $CoO_3$, $MnO_3$ and CuO) particles. The oxide thin layer may be formed on a p-type conventional semiconductor substrate by a solution process such as spin coating method. The coated solution was dried at 60° C. and may be treated for 1 h at least 500° C. or 700° C.

The p-type organic semiconductor layer comprises tetrathiafulvalene or a tetrathiafulvalene derivative.

The n-type organic semiconductor comprises one of fullerene 60, fullerene 70 and graphene.

During manufacture, an n-type organic semiconductor layer is coated on the substrate using a thermal evaporation method.

The thickness of the n-type organic semiconductor (n-OSC) layer may be controlled by the rate of deposition. The thickness of the n-type organic layer may be from 50 nm 100 nm. The n-type organic photoactive layer may be formed from a group of various organic materials such as fullerene 60, fullerene 70 and their derivatives.

During manufacture, a p-type organic semiconductor (p-OSC) layer is coated on the n-type organic photoactive layer using a sol-gel spin coating or drop casting method. The thickness of the organic photoactive layer may be controlled by the spin rate of the spin coater. The thickness of the organic layer may be from 50 nm 100 nm. The p-type organic photoactive layer may be formed from a group of various organic materials such as the tetrathiafulvalene (TTF), its derivatives, organic charge transfer-compounds containing TTF.

The organic photoactive layer absorbs solar light radiation to generate an electrical current. In an organic photodiode, solar light radiation must reach a photoactive layer so that it can covert light absorption to electric current. The solar light irradiation is related to relevant wavelengths to be transmitted via the organic photoactive layer to generate the photocurrent. The desired photoresponse properties may be provided by controlling the thickness of the organic layer. The organic layer is an organic semiconductor material. The organic semiconductors are grouped as low molecular weight materials and polymers. These materials have a conjugated π-electron system. The organic semiconductors are formed from s and p bonding. The backbone of the molecules is constituted generally with s bonds. The p bonding is responsible for electrical conductivity of the organic semiconductors. The electrical conductivity of the organic semiconductors depends on the conjugation structure in the materials. The electrical and optoelectronic properties of the organic semiconductors are tuned using the techniques in organic chemistry.

The substrate may be rigid or flexible structure that provides desired structural properties. Inorganic semiconductors are examples of preferred rigid substrate materials. The preferred flexible substrate materials are conducting metal coated plastics and metal foils. The desired optical properties may be provided by controlling the thickness of the substrate. The substrate may be formed from p-type silicon, n-type silicon, p-type gallium arsenide, n-type gallium arsenide, p-type indium phosphor and n-type indium phosphor. The various inorganic semiconductor substrates may be used as substrate and the electrical properties may be improved by doping process. Optionally, the surface of semiconductor substrate material may be subjected to various chemical baths to improve photoresponse properties of the photodiode. A thin oxide layer may be formed in the surface of the substrate to generate interface charges.

The photodiode is referred as a planar structure, as shown in FIG. 1. FIG. 1 shows the schematic diagram of the pnpn photodiode. A bias voltage is applied to an inorganic p-n junction 1-2 and an organic p-n junction 3-4. The hybrid photodiode was illuminated by solar light, the solar light changes the width of the depletion region of the inorganic p-n junction and p-n organic junction.

The inorganic semiconductors and organic semiconductors (OSCs) serve as a photoactive junction which may be used to fabricate a hybrid photodiode. The photodiode acts to convert solar light to electrical current. Accordingly, the term "hybrid photodiode" may refer to, for example, an inorganic semiconductor-metal oxide semiconductor junction (pn), p-type and n type organic semiconductors junction. In the hybrid photodiode, the charge carriers are generated from the depletion regions of inorganic p-n junction and the organic semiconductor p-n junction under an electric field.

The organic pn junction 3-4 absorbs the solar light to generate excitons. The excitons are separated in the electric field and can flow to the anode and cathode electrodes to generate photocurrent. The organic layers 3 and 4 are selected for their optical properties. Photoresponse properties of the diode may be strongly dependent on its absorbance and the photosense properties may be tuned by controlling of its thickness and absorbance. The photoresponsivity of the photoactive layer for solar light irradiation is achieved by the energy band gap of the organic semiconductor. The excitons are formed by the energy absorbed by the organic photoactive layer whose optical band gap energy is lower than the incident photon energy. The photo charge transport mechanism of the pnpn photodiode can be explained as follows; inorganic p-n junction series with organic p-n junction absorbs solar light and causes a separation of electron and hole. In reverse bias, the hole can flow out the photodiode and can catch the electron. A large number of the charge carriers in the photodiode will be generated by strong electric fields. The photogenerated charge carriers will be received by electrodes and in turn, a photoconductive gain is formed.

In a preferred embodiment, in the hybrid photodiode, a photoactive layer is formed using a soluble organic semiconductor and having at least an electrical conductive property. The hybrid photodiode exhibits a higher photoresponsivity performance, when inorganic p-n junction and the organic p-n junction are respectively formed between conventional semiconductor 1 and metal oxide layer 2 and between p-type semiconductor 3 and n-type organic semiconductor 4.

As an example of manufacturing, a conventional semiconductor, such as a p-type semiconductor 1 is provided. Then, a metal oxide layer is coated on p-type conventional semiconductor 2. Then, a p-type organic semiconductor is coated on metal oxide layer 3 and then, n-type organic semiconductor 4 is coated on p-type organic semiconductor 3.

The hybrid photodiode exhibits a photocurrent and photoresponse ratio. The hybrid photodiode comprises an organic p-n junction in which, for example, a tetrathiafulvalene (TTF) organic semiconductor (e.g., layer 3) and a graphene layer (e.g., layer 4) work as a photoactive layer. The organic semiconductor is a photoactive layer having a high π-donating ability, which is the case with tetrathiafulvalene.

The hybrid photodiode may have a p-n junction in which YSrA oxide layer works as a tunneling layer. This layer is formed on the surface of the semiconductor. This layer causes the electron tunneling to occur with a high transmission coefficient.

In an embodiment, the photoresponse properties of the hybrid photodiode can be controlled by the production parameters or coating parameters. The spin coating deposition may be used to deposit organic semiconductor (3) and oxide layers 2 into inorganic semiconductors. The thickness of the photoactive and buffer layers may be controlled by layer-by-layer deposition that involves repeated steps of solution coating. The film thickness of the photoactive and buffer layers may be increased by repeating steps of the films.

In another embodiment, the organic semiconductors (p-OSC and n-OSC) and oxide buffer layer (OBL) can be selected based on the spectrum of solar light that the hybrid photodiode is intended to detect. The detection wavelength is related to the optical band gap of the organic semiconductor.

In a preferred embodiment, the wafer or substrate layer may be a p-type semiconductor, more preferably p-type doped silicon or n-type doped silicon and most preferably p-type silicon. The organic photoactive layer is sandwiched between metal oxide composite buffer layer and top metal electrode. The organic layer is obtained by depositing a film of solution of organic material.

In an embodiment of this invention, a photodiode is characterized and it is useful to detect solar light operated at voltage (V) bias as a photoconductive detector or photovoltaic detector or as a photodiode in reverse bias. The photodiode may be employed to detect photons with energies from UV to visible. The optical band gap of the organic layer controls the photosensitivity of the diode by the optical band gap.

FIG. 2 shows the current-voltage characteristics of the hybrid photodiode 5 fabricated on a p-type doped silicon substrate. FIG. 2 shows the current-voltage characteristics of the photodiode under dark and illumination conditions. The hybrid photodiode operates as a rectifying contact when it was not illuminated by solar light. The current voltage characteristics of hybrid photodiode under dark condition can be analyzed by the following relation $$1 = AA^*T^2\exp(-\beta d)\exp\left(-\frac{q\phi_b}{kT}\right)\exp\left(\frac{qV}{nkT}\right)\left[1-\exp\left(-\frac{qV}{kT}\right)\right]$$

where A is the contact area, A* is the Richardson constant, T is the temperature, $\phi_b$ is the barrier height and $\beta$ is the tunneling constant.

FIG. 3 shows current-voltage characteristics of the photo diode under dark conditions. The reverse bias current of the diode is smaller than forward bias current due to a potential energy barrier for electrons formed at a semiconductor junction. This barrier ($\phi_B$) is the primary characteristic of the junction barrier and depends on the characteristics of inorganic semiconductor and organic semiconductor.

The photoresponse properties of the hybrid photodiode may be controlled by the solar light and the electric field simultaneously. The hybrid photodiode may exhibit both photovoltaic behavior and photoconductive behavior. When the diode was illuminated by sufficient photon energy, the electron and hole pair is formed in the junction and photo-generated charges are swept from the interface of the diode by the built in electric field of the depletion. The photo-generated charges move to electrodes, in which the holes move to the anode and electrons move to cathode and in turn, a photocurrent is formed. The dark current and photocurrent are the total current of the hybrid photodiode and determine the photoconductive gain or photovoltaic gain. As used herein, a photodiode converts solar light into the current when photons are absorbed. A dark current is also produced when no light is present.

FIG. 2 shows the photocurrent-power intensity characteristics of the hybrid photodiode. FIG. 3 shows a linear photocurrent behavior. The photoresponsivity of the diode is $1.30 \times 10^{-4}$ A/W. The hybrid junction diode is linearly controlled by solar light. In a preferred embodiment, the organic photodiode operates in a photoconducting and photovoltaic modes under solar light illumination. In a preferred embodiment, the photodiode is formed with two junctions comprising of inorganic and organic semiconductor junctions. The diode is often reverse biased and it works in the photovoltaic mode. The cathode is driven by a positive voltage with respect to the anode. In the preferred embodiment, the hybrid photodiode exhibits a photocurrent gain, ratio of photocurrent to dark current, in photoconductor mode of at least 1300 at −5 V.

EXAMPLES

Preparation of the Photodiode

In one embodiment of the invention, a high photoresponsivity hybrid photodiode is provided. The hybrid photodiode is based on an inorganic p-n junction and an organic p-n junction. The photodiode has the structure: Al/p-SC/n-OBL/p-OSC/n-OSC/Al. p-OSC is a tetrathiafulvalene (TTF) organic semiconductor, which absorbs the light in the spectral region from 350 nm to 700 nm. n-OSC is fullerene 60 or fullerene 70 or n-type graphene.

TTF is a sulfur-rich π-functional system with the formula $(H_2C_2S_2C)_2$. TTF is related to the hydrocarbon fulvalene, $(C_5H_4)_2$, by replacement of four CH groups with sulfur atoms.

A photoconductive gain was measured of at least $1.0 \times 10^3$ under −5V and 100 mW/cm$^2$.

The p-n heterojunction diode was fabricated using a metal oxide layer on p-type silicon with a 400 μm thickness and with a resistivity of 1-10 Ω·cm resistivity and (100) orientation. The p-type silicon substrate was cleaned by chemical baths and followed by ultrasonic treatment for 5 minutes.

The photoactive junction layers were deposited by spin coating or vacuum deposited methods and anode (100 nm) and cathode (100 nm) electrodes were coated via thermal evaporation or sputtering methods in a high vacuum chamber with a pressure of $10^{-5}$ Torr. The metal oxide layer was coated on p-type silicon wafer. The p-type organic layer 3 was coated on the oxide buffer layer (OBL) 2 and the n-type semiconductor 4 was coated on p-type organic semiconductor 3. Finally, the top electrode Al electrode was evaporated onto organic semiconductor layer through a shadow mask with 1 mm diameter circles.

The electrical and photoresponse properties of the photodiodes in dark and illuminated solar illumination from a 150 W FYTRONIX solar simulator were measured using a FYTRONIX electronic device characterization system. The illumination intensity was changed using a variable power supply and optical meter.

This application describes particular examples and preferred embodiments. As will be apparent to one of skill in the art, the present invention is not limited to preferred embodiments and particular examples.

The invention claimed is:

1. A hybrid junction photodiode, comprising:
    an inorganic p-n junction having at least one inorganic semiconductor layer and at least one metal oxide semiconductor layer, wherein the metal oxide semiconductor layer is a ternary metal oxide and has the general formula $Y_{1-x}Sr_xA$, where A is selected from the group consisting of ZnO, CdO, CoO$_3$, and MnO$_3$ and where $0 \leq x \leq 1$; and
    an organic p-n junction having at least one p-type organic semiconductor layer and at least one n type organic semiconductor layer;
    wherein said inorganic p-n junction and said organic p-n junction are electrically connected in series.

2. The hybrid junction photodiode of claim 1, wherein the p-type organic semiconductor layer or the n-type organic semiconductor layer is a photoactive layer.

3. The hybrid junction photodiode of claim 2, wherein the p-type organic semiconductor layer is selected from the group consisting of tetrathiafulvalene (TTF) organic semiconductor, derivatives of TTF, and organic charge transfer compounds containing TTF.

4. The hybrid junction photodiode of claim 2 wherein the n-type organic semiconductor layer is selected from the group consisting of fullerene 60, fullerene 70, and graphene.

5. The hybrid junction photodiode of claim 2, wherein an optical band gap of the organic p-n junction having the at least one p-type organic semiconductor layer and the n-type organic semiconductor layer ranges from 1.1 and 2.32 eV.

6. The hybrid photodiode of claim 2, wherein a mobility of the organic p-n junction having the at least one p-type organic semiconductor layer and the at least one n-type organic semiconductor layer ranges from at least $1 \times 10^{-3}$ to 1.3 cm$^2$/V·s.

7. The hybrid junction photodiode of claim 1 configured to have a ratio of photocurrent to dark current of at least 1300 at −5 V.

8. The hybrid junction photodiode of claim 1 configured to have a photoresponsivity of at least 0.1 A/W.

9. The hybrid junction photodiode as claimed in claim 1, wherein the organic semiconductor layer is a soluble organic semiconductor.

10. The hybrid junction photodiode as claimed in claim 1, wherein the organic p-n junction is responsive to electromagnetic radiation from solar light comprising one or more of ultraviolet (UV) and infrared radiation.

11. The hybrid junction photodiode as claimed in claim 1, wherein the organic p-n junction is responsive to solar radiation having a wavelength ranging from 300 nm to 750 nm.

12. The hybrid junction photodiode as claimed in claim 1 configured as or as part of an absorption controlling device.

13. The hybrid junction photodiode as claimed in claim 1, further comprising a light source that has a color temperature of at least 4500 K.

14. The hybrid junction photodiode as claimed in claim 1, further comprising a light source that is two electrodes that an arc, or flame flows across.

15. The hybrid junction photodiode as claimed in claim 1, wherein a photocurrent of the hybrid junction photodiode is 1000 times than dark current under 1000 W/m$^2$.

16. The hybrid junction photodiode as claimed in claim 1, wherein a photoresponsivity of the hybrid junction photodiode is controlled by interface of inorganic semiconductor pn junction and organic semiconductor p-n junction.

17. The hybrid junction photodiode as claimed in claim 1, wherein a photocurrent of the hybrid junction photodiode is 1000 times than dark current under 1000 W/m$^2$.

18. The hybrid junction photodiode as claimed in claim 1, wherein a photoresponsivity of the hybrid junction photodiode is controlled by interface of inorganic semiconductor pn junction and organic semiconductor p-n junction.

19. A hybrid junction photodiode, comprising:
- an inorganic p-n junction having at least one inorganic semiconductor layer and at least one metal oxide semiconductor layer, wherein the metal oxide layer comprises YSrMO, where M is selected from the group consisting of Zn, Cd, Co, and Mn; and
- an organic p-n junction having at least one p-type organic semiconductor layer and at least one n type organic semiconductor layer;
- wherein said inorganic p-n junction and said organic p-n junction are electrically connected in series.

20. The hybrid junction photodiode of claim 19, wherein the p-type organic semiconductor layer or the n-type organic semiconductor layer is a photoactive layer.

21. The hybrid junction photodiode of claim 20, wherein the p-type organic semiconductor layer is selected from the group consisting of tetrathiafulvalene (TTF) organic semiconductor, derivatives of TTF, and organic charge transfer compounds containing TTF.

22. The hybrid junction photodiode of claim 20 wherein the n-type organic semiconductor layer is selected from the group consisting of fullerene 60, fullerene 70, and graphene.

23. The hybrid junction photodiode of claim 20, wherein an optical band gap of the organic p-n junction having the at least one p-type organic semiconductor layer and the n-type organic semiconductor layer ranges from 1.1 and 2.32 eV.

24. The hybrid photodiode of claim 20, wherein a mobility of the organic p-n junction having the at least one p-type organic semiconductor layer and the at least one n-type organic semiconductor layer ranges from at least $1\times10^{-3}$ to 1.3 cm$^2$/V·s.

25. The hybrid junction photodiode of claim 19 configured to have a ratio of photocurrent to dark current of at least 1300 at −5 V.

26. The hybrid junction photodiode of claim 19 configured to have a photoresponsivity of at least 0.1 A/W.

27. The hybrid junction photodiode as claimed in claim 19, wherein the organic semiconductor layer is a soluble organic semiconductor.

28. The hybrid junction photodiode as claimed in claim 19, wherein the organic p-n junction is responsive to electromagnetic radiation from solar light comprising one or more of ultraviolet (UV) and infrared radiation.

29. The hybrid junction photodiode as claimed in claim 19, wherein the organic p-n junction is responsive to solar radiation having a wavelength ranging from 300 nm to 750 nm.

30. The hybrid junction photodiode as claimed in claim 19 configured as or as part of an absorption controlling device.

* * * * *

UNITED STATES PATENT AND TRADEMARK OFFICE
CERTIFICATE OF CORRECTION

PATENT NO. : 10,964,899 B1
APPLICATION NO. : 17/089796
DATED : March 30, 2021
INVENTOR(S) : Abdullah G. Al-Sehemi et al.

Page 1 of 1

It is certified that error appears in the above-identified patent and that said Letters Patent is hereby corrected as shown below:

On the Title Page

Item (72), Please correct the inventors' residences as follows:
(1) Al-Sehemi, Abdullah G: Abha, Saudi Arabia
(3) Kalam, Abul: Abha, Saudi Arabia
(4) Dere, Aysegul: Elazig, Turkey
(5) Yakuphanoglu, Fahrettin: Elazig, Turkey Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*